United States Patent

Mukai et al.

Patent Number: 5,585,658
Date of Patent: Dec. 17, 1996

[54] SEMICONDUCTOR DEVICE HAVING DIFFUSION REGIONS FORMED WITH AN ION BEAM ABSORBER PATTERN

[75] Inventors: Takao Mukai; Nobuyuki Yoshioka, both of Hyogo-ken, Japan

[73] Assignee: Mitsubishi Denki Kabushiki Kaisha, Tokyo, Japan

[21] Appl. No.: 485,708

[22] Filed: Jun. 7, 1995

Related U.S. Application Data

[60] Continuation of Ser. No. 187,329, Jan. 26, 1994, abandoned, which is a division of Ser. No. 846,722, Feb. 24, 1992, abandoned, which is a continuation of Ser. No. 500,171, Mar. 28, 1990, abandoned.

[30] Foreign Application Priority Data

Mar. 29, 1989 [JP] Japan .................................. 1-79208
Mar. 6, 1990 [JP] Japan .................................. 2-54516

[51] Int. Cl.⁶ .................................. H01L 29/76
[52] U.S. Cl. .................. 257/344; 257/408; 257/657
[58] Field of Search .................. 257/344, 408, 257/336, 401, 657

[56] References Cited

U.S. PATENT DOCUMENTS

| | | |
|---|---|---|
| 4,325,180 | 4/1982 | Curran . |
| 4,346,512 | 8/1982 | Liang et al. . |
| 4,382,826 | 5/1983 | Pfleiderer et al. . |
| 4,728,617 | 3/1988 | Woo et al. . |
| 4,755,479 | 7/1988 | Miura . |
| 4,814,244 | 3/1989 | Koguchi et al. . |
| 4,818,715 | 4/1989 | Chao . |
| 4,855,247 | 8/1989 | Ma et al. . |
| 4,865,952 | 9/1989 | Yoshioka et al. . |
| 4,894,694 | 1/1990 | Cham et al. ............... 257/344 |
| 4,963,504 | 10/1990 | Huang . |

FOREIGN PATENT DOCUMENTS

| | | |
|---|---|---|
| 54-22275 | 8/1979 | Japan . |
| 54-101286 | 8/1979 | Japan ................ 257/408 |
| 58-97874 | 6/1983 | Japan . |
| 58-184763 | 10/1983 | Japan . |
| 59-78575 | 5/1984 | Japan . |
| 62-58682 | 3/1987 | Japan . |
| 63-95670 | 4/1988 | Japan ................ 257/344 |
| 1-194321 | 8/1989 | Japan . |

OTHER PUBLICATIONS

Fairfield, "Masking Technique for Ion Implantation", IBM Technical Disclosure Bulletin, vol. 13, No. 3, Aug. 1970, pp. 806.
Wolf et al., "Silicon Processing for the VLSI Era", vol. 1, Lattice Press, Sunset Beach, CA, pp. 504–511.

*Primary Examiner*—Sara W. Crane
*Assistant Examiner*—Courtney A. Bowers
*Attorney, Agent, or Firm*—Lowe, Price, LeBlanc & Becker

[57] ABSTRACT

In implantation of ions into a wafer, in the manufacture of a semiconductor device, a desired ion beam absorber pattern having locally different thicknesses is previously formed on a major surface of the wafer. The ion beam absorber pattern absorbs an ion beam to be implanted and is formed of a thin film material with its absorbency varying depending on its thickness. Ions are implanted once on the major surface of the wafer through this ion beam absorber pattern to form desired different impurity profiles in depth of desired regions on the major surface of the wafer.

4 Claims, 9 Drawing Sheets

NORMAL LDD $\begin{cases} W_1 = W_2 \\ t_1 = t_2 \\ U_1 = U_2 \end{cases}$

FIG.4B

MODIFIED LDD $\begin{cases} W_1 > W_2 \\ t_1 < t_2 \\ \quad (t_1 = t) \\ U_1 = U_2 \end{cases}$

SEMICONDUCTOR DEVICE HAVING DIFFUSION REGIONS FORMED WITH AN ION BEAM ABSORBER PATTERN

This application of application Ser. No. 08/187,329 filed Jan. 26, 1994, now abandoned, which is a division of application Ser. No. 07/846,722 filed Feb. 24, 1992, now abandoned, which is a continuation of application Ser. No. 07/500,171 filed Mar. 28, 1990, now abandoned.

BACKGROUND OF THE INVENTION

1. Field of the Invention

The present invention relates generally to a method of ion implantation, and more particularly to an ion implantation method carrying out a single step of ion implantation to produce impurity regions that vary in impurity concentration both in depth into and laterally on the surface of a wafer.

2. Description of the Background Art

Semiconductor devices have been developed remarkably in recent years. A fast operation and miniaturization of the devices are required as well as a good yield of production.

In order to achieve the miniaturization of the devices, an impurity diffusion layer is formed in a wafer of a semiconductor device. There are two methods as a method of forming the impurity diffusion layer: a method of implanting ions into the wafer, and a method of making ions permeate into the wafer. According to the ion implantation method, accelerated ions are implanted through a mask for ion implantation in depth into the surface of the wafer, go through the wafer and stop therein. Thereafter, the implanted ions are activated by heat treatment (annealing). Meanwhile, according to the ion permeation method, the wafer is placed in gas atmosphere at a high temperature including ions, and permeation of ions into the wafer and heat treatment (annealing) of the ions permeated are carried out at the same time; however, the ions permeate both laterally and longitudinally into the wafer, and thus it is difficult to accurately control the permeation of the ions.

Therefore, the ion implantation method is especially superior as a method of forming an impurity diffusion region in the wafer for achieving the miniaturization of the semiconductor device in the following characteristics: (1) The amount of and distribution of impurities in depth can be controlled accurately in accordance with acceleration voltage of ions, ion current and ion implantation time, and thus the same amount of and the same distribution of impurities in depth can be attained repetitively under the same control condition, (2) Impurities can be added uniformly over the whole surface of the wafer, (3) Selective implantations into micro portions are available or the like.

In order to optimally control an impurity profile (the profile here means distribution) formed in the inner portion of the wafer by employing the above ion implantation method, various methods have been developed of forming a mask for ion implantation.

FIGS. 9A–9G are sectional views showing one example of conventional steps of manufacturing a mask for ion implantation and forming a base region of a bipolar transistor and a conventional method of ion implantation, disclosed in Japanese Patent Publication No. 54-22275.

Figure 9A:
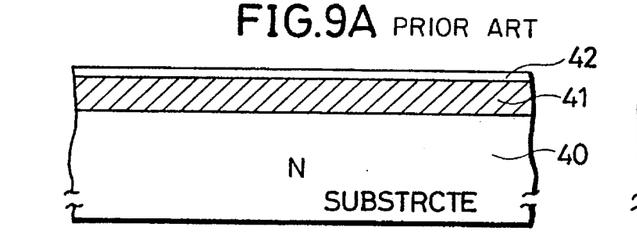
FIGS. 9A–9G are sectional views showing one example of conventional steps of manufacturing a mask for ion implantation, and a conventional method of ion implantation disclosed in Japanese Patent Publication No. 54-22275.

Referring to FIG. 9A, a $SiO_2$ film 41 is formed on the surface of an n type Si substrate 40 with about 20Ω-cm of n type resistivity. The $SiO_2$ film 41 is formed to a thickness of about 0.7 μm by oxidation of the n type Si substrate 40 in wet oxygen at 1,200° C. for about 50 min. The n type Si substrate 40 that the $SiO_2$ film 41 is formed on its surface is then heated in a $P_2O_5$ gas atmosphere at 1,100° C. for about 30 min. to form a phospho-silicate glass layer 42 on the surface of the $SiO_2$ film 41.

Figure 9B:
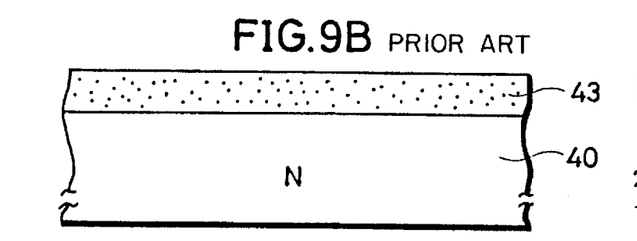

Referring to FIG. 9B, a $SiO_2$ film 43 including P, which is a first shielding film, is formed on the surface of the n type Si substrate 40. The $SiO_2$ film 43 is formed by heating the n type Si substrate 40 including the $SiO_2$ film 41 and the phospho-silicate glass layer 42, shown in FIG. 9A, in a $N_2$ gas atmosphere at 1,200° C. for about two hours. In this case, the concentration of P included in the $SiO_2$ film 43 is highest at its surface and becomes lower as a function of depth into the substrate.

Figure 9C:
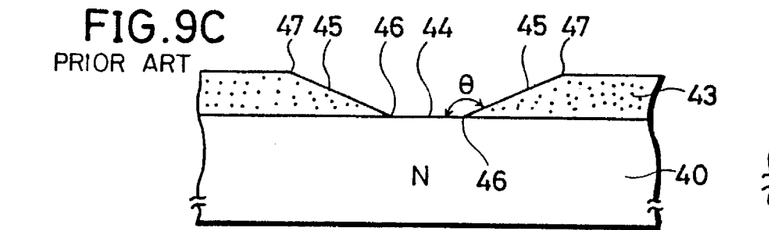

As shown in FIG. 9C, a first ion implantation window 44 is then formed on the $SiO_2$ film 43 by photo-etching. As more P becomes included in the $SiO_2$ film 43, the etching rate of the $SiO_2$ film 43 increases. Because the concentration of P is reduced as a function of depth into the substrate, the etching rate of the $SiO_2$ film 43 decreases as a function of depth. Thus, an angle θ between the surface of the n type Si substrate 40 and the side surface of the ion implantation window 45 is approximately 170°, and thus the first ion implantation window 44 with a large side edge is formed.

In this case, an intersection 46 indicates an intersection between the side surface region of the ion implantation window 45 and the n type Si substrate 40, and an intersection 47 indicates an intersection between the surface of the $SiO_2$ film 43 and the side surface region of the ion implantation window 45.

Figure 9D:
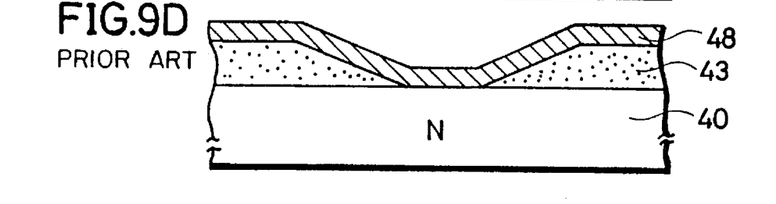

Next, as shown in FIG. 9D, an Al film 48 is formed by evaporation of Al on the surface of the $SiO_2$ film 43 including P, without eroding the film 43. The Al film 48 is etchable, which is a second shielding film with a thickness of approximately 0.4 μm.

Figure 9E:
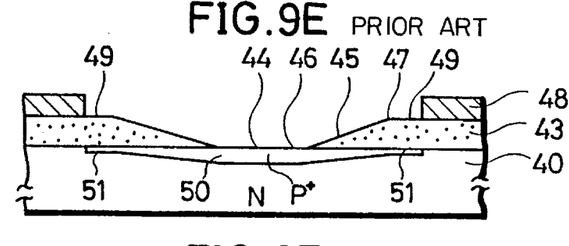

As shown in FIG. 9E, a second ion implantation window 49 is formed on the Al film 48 by photo-etching. This ion implantation window 49 is formed about 10 μm outward from the intersection 47 on the side surface of the first ion implantation window 45. B ions are then implanted in the n type Si substrate 40 under the condition of about 200 keV, about $1\times10^{14}$ atoms/cm². After ion implantation, a p⁺region 50 is formed under a region of the first ion implantation window 44 where the $SiO_2$ film 43 including P is etched away. The p⁺region 50 is about 0.8 μm deep at its deepest portion and is implanted with B ions of about $1\times10^{14}$ atoms/cm². Since the thickness of the $SiO_2$ film 43 becomes greater from the intersections 46 to 47 on the side surface of the ion implantation window 45, an ion shielding effect becomes greater in B-ion implantation. Therefore, the depth of the p⁺region 50 formed through B-ion implantation becomes smaller from the intersection 46 to the intersection 47, and thus the amount of B ions implanted in the n type Si substrate 40 is decreased. Furthermore, a small region 51 having a slightly reduced concentration of p type is formed in the n type Si substrate 40 beneath the $SiO_2$ film 43 with a thickness of about 0.7 μm. Moreover, since the Al film 48 of about 0.4 μm in thickness is formed outside the second ion implantation window 49, no B-ions are implanted in the n type Si substrate 40 directly beneath the Al film 48.

Figure 9F:
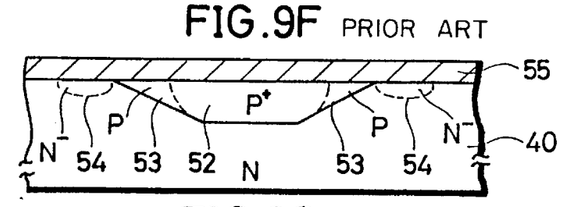

Referring to FIG. 9F, the n type Si substrate 40 that the Al film 48 and $SiO_2$ film 43 are removed is oxidized in dry oxygen at 1,000° C. for about 90 min. This oxidization causes the depth of ion diffusion in the n type Si substrate 40 to be greater with a larger amount of B ions implanted. Thus, ions are diffused in the greatest depth at the central portion of the p⁺region 50, thereby forming a deepest p⁺impurity diffusion region 52. A p type diffusion region 53 is formed in a peripheral region of the central portion of the p⁺region 50. The p type diffusion region 53 has a smaller depth of diffusion outward the p⁺diffusion region 52 depending on the amount of ions to be implanted. Since the p region 51 is implanted with a smaller amount of B ions, the region 51 combines with n type impurities of the n type Si substrate 40 through oxidation, resulting in an n type high resistivity region 54. Further, a $SiO_2$ film 55 is formed on the surface of the n type Si substrate 40.

Figure 9G:
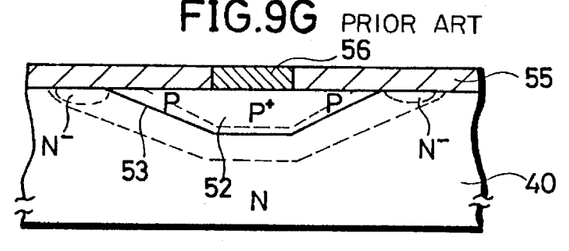

Referring to FIG. 9G, a window for a contact is formed in the $SiO_2$ film 55 with a portion of the $SiO_2$ film 55 removed. An Al electrode 56 is formed in this window.

As described above, dual mask formations control the state of impurity profiles due to implantation of ions into the n type Si substrate 40.

However, in a first conventional example (referred to Japanese Patent Publication No. 54-22275), the $SiO_2$ film and the Al film 48, which serve respectively as the first and second shielding films on the substrate 40 in ion implantation, are formed by photo-etching. Since the photo-etching requires a photo-mask alignment, there is a problem that as a design pattern on the substrate 40 is miniaturized, an influence due to accuracy of the photo-mask alignment becomes greater. Moreover, there are other problems as follows. In the formation of the ion implantation windows 44 and 49 by photo-etching, it is difficult to form the miniaturized pattern because of a poor control of the dimension of the windows in a horizontal direction. Further, in this example, it is possible to form an impurity profile with different depths successively in the wafer; however, it depends on its shape in etching a material to be a shielding film in impurity implantation, and hence, this profile has a limited shape and requires the dual mask alignment in formation of one impurity profile. Further, the formation of the impurity profile is time-consuming since it employs an etching technology. Thus, with the shape of the impurity profile in the wafer complicated, a plurality of the steps of forming the impurity profile are required, resulting in degradation in accuracy of the impurity profile.

FIGS. 10A–10H are sectional views showing another example of the conventional steps of manufacturing a mask for ion implantation and a conventional method of ion implantation using anisotropical etching, disclosed in Japanese Patent Laying Open No. 62-58682.

Figures 10A, 10B, 10C, 10D, 10F, 10G, 10H:
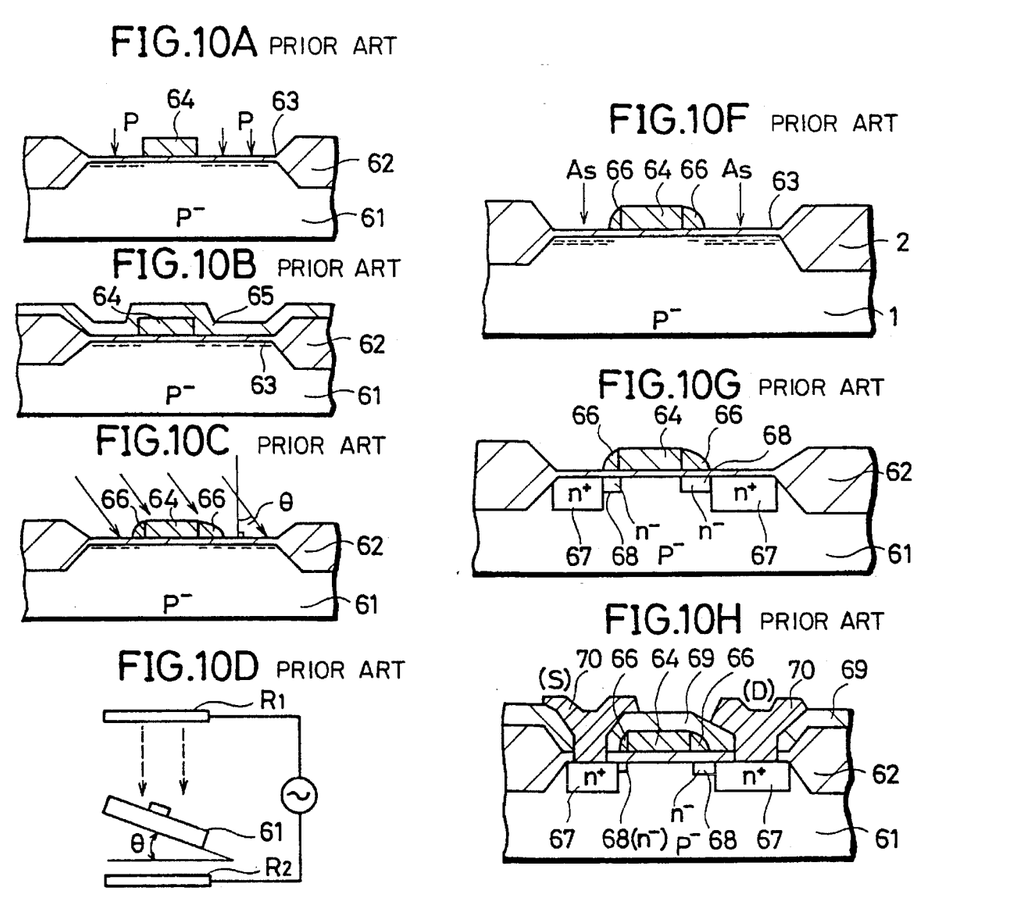
FIGS. 10A–10H are sectional views showing another example of the conventional steps of manufacturing a mask for ion implantation and the conventional method of ion implantation, disclosed in Japanese Patent Laying Open No. 62-58682.

Referring to FIG. 10A, a p⁻Si substrate 61 is of high resistivity, and an isolation oxide film 62, e.g., a $SiO_2$ film, is formed by selective oxidation process (or isoplanar). A gate oxide film 63 is a thin film of 500 to 1,000 Å in thickness, formed on the surface of the p⁻Si substrate 61 by thermal oxidation. Further, a polysilicon gate 64 is made by patterning polysilicon, deposited on the gate oxide film 63 to a thickness of about 3,000 Å, so as to be of a predetermined gate length through photo-etching.

Ion-implanting of P type impurities into the p⁻Si substrate 61 formed as described causes formation of a low concentration impurity layer through the gate oxide film 63 in the surface of the p⁻Si substrate 61. In this ion implantation, the polysilicon gate 64 and the isolation oxide film 62 serve as shielding films for ion implantation.

Next, referring to FIG. 10B, an insulator film 65 is formed on the surfaces of the isolation oxide film 62, the gate oxide film 63 and the polysilicon gate 64. The insulator film 65 is of silicon oxide formed by CVD (Chemical Vapor Deposition), e.g., a high-temperature low-pressure growth. The insulator film 65 is formed to a thickness of 2,000 to 3,000 Å.

As shown in FIG. 10C, the insulator film 65 is etched away from its surface by dry etching. The dry etching is carried out by ion implantation with a $CHF_3$ gas. At this time, inclining a direction of implanting ions by an angle θ, e.g, about 20°–30°, with respect to the right angle to the substrate, as shown in the figure, allows the insulator film 65 to remain at a portion contacting the polysilicon gate 64 and thus causes spacers 66 to be formed asymmetrically on opposite sides of the polysilicon gate 64.

As means for altering the direction of implanting ions, as shown in FIG. 10D, inclining the p⁻Si substrate 61 by an angle θ with respect to a vertical direction from an upper electrode R1 to a lower electrode R2 enables a selection of an arbitrary angle of implanting ions with respect to the p⁻Si substrate 61.

Figure 10E:
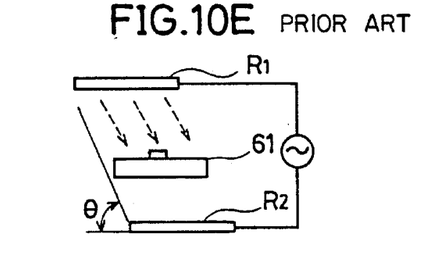

Alternatively, as shown in FIG. 10E, relatively and horizontally shifting the respective positions of the upper electrode R1 and the lower electrode R2 allows alteration of the direction of implanting ions (the angle θ) into the p⁻Si substrate 61 between these electrodes.

Next, as shown in FIG. 10F, As (arsenic) ions are implanted in the whole surface of the p⁻Si substrate 61 in which the spacers 66 are formed. The ions are introduced with high concentration into the surface of the p⁻silicon substrate 61 through the gate oxide film 63 to form a high concentration impurity layer. At this time, the polysilicon gate 64 and the spacers 66 serve as shielding films in ion implantation.

As shown in FIG. 10G, an offset gate n⁻layer 68, which is a low concentration n⁻layer to be an offset portion, is formed on the surface of the p⁻Si substrate 61 beneath the spacers 66, and at the same time, a source/drain n⁺layer 67, which is a high concentration n⁺layer to be a source/drain, is formed in the other portions of the substrate 61 where the spacers 66 are not formed. The layers 67 and 68 are formed by diffusing impurities such as P or As in the p⁻Si substrate 61 through annealing (a heat treatment). In this case, as for the width of the offset gate n⁻layer 68, the left side portion (the source side) of the layer 68 is formed in smaller width than the right portion (the drain side) in proportion to the width of the spacers 66 which are formed asymmetrically.

Next, as shown in FIG. 10H, a source/drain Al electrode 70 is formed to perfect an n channel MOSFET (Metal Oxide Semiconductor Field Effect Transistor) of an LDD (Lightly Doped Drain) structure. The source/drain Al electrode 70 is formed by forming a $CVD.SiO_2$ film 69 or the like, as an insulation film on the whole surface of the p⁻Si substrate 61 shown in FIG. 10G, then etching away a source/drain portion by contact photo-etching, and depositing evaporated Al on this portion by photo-etching.

In another conventional example (referred to Japanese Patent Laying Open No. 62-58682), the spacers 66 serving as a shielding film in ion implantation are formed by anisotropic etching. However, there are problems in this example as follows. The anisotropic etching needs to limit a direction of a transistor with respect to a semiconductor substrate, and thus it is limited in pattern designing. In addition, since a ratio of the width of the larger spacer 66 formed in contact with the polysilicon gate 64 to that of the smaller spacer 66 depends on an angle of oblique anisotropic etching, it is difficult to increase this ratio. Furthermore, in this example, the source/drain is formed in the wafer asymmetrically; however, this formation depends on the oblique anisotropic etching of the spacers 66, so that a direction of the gate with respect to the substrate is limited to one direction. Moreover, due to this limitation of the oblique etching, the substrate should be set obliquely to the direction of ion implantation between the upper and lower electrodes. Therefore, the following disadvantages also arise. That is, a distance between these two electrodes is limited; the substrate is fixed with difficulty; and the impurity profile cannot have configurations.

SUMMARY OF THE INVENTION

It is an object of the present invention to provide a method of ion implantation capable of forming desired different impurity profiles in depth directions of two or more of desired regions on a major surface of a wafer by one-time ion implantation.

In order to achieve the above object, in a method of ion implantation in accordance with the present invention, a desired ion beam absorber pattern with locally different thicknesses is previously formed on the major surface of the wafer in implanting ions in the wafer in manufacturing a semiconductor device. The ion beam absorber pattern absorbs an implanted ion beam and is formed of a thin film material with its absorbency varying depending on its thickness. Implanting ions once on the major surface of the wafer through the ion beam absorber pattern causes absorption of kinetic energy of the ions, depending on the thickness of the absorber. Thereafter, the ion beam absorber pattern is removed from the major surface of the wafer. Thus, since the kinetic energy of the implanted ions and a current density attain desired values in the wafer beneath the ion beam absorber pattern, desired different impurity profiles can be formed in the depth direction of the desired regions on the major surface of the wafer. Therefore, the impurity profiles can have a plurality of or any number of configurations without the limitation of the shape of the impurity profiles. Further, ideal asymmetric impurity profiles can be formed in the formation of the source/drain of the transistor.

Furthermore, in consideration for lowering resistances of the source and drain sides, lowering an electric field in the vicinity of the drain near the side surface of the gate, lowering the impurity concentration in the vicinity of each pn junction region in the substrate and the like, the impurity profiles can be optimized independent of the size of the gate. This optimization of the profiles results in such effects as improved properties of the transistor, an inhibited punch through, a reduced hot electron effect, an increased breakdown voltage for an ON state, and an increased junction breakdown voltage of each pn junction. These effects become effective with further miniaturization of the device.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

The embodiments of the present invention will now be described with reference to the figures.

In the first embodiment, since a mask for ion implantation is formed by X-ray exposure, the following method of mask formation is called X-ray type.

Figure 1A:
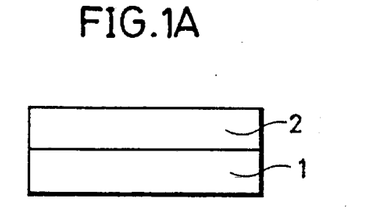
FIGS. 1A–1H are schematic sectional views showing the steps of manufacturing an n channel field effect semiconductor device of a first embodiment of the present invention.

As shown in FIG. 1A, an n type wafer 1 with a thickness of about 600 μm is provided including a p type well 2 formed to a thickness of about 5 μm therein.

Figure 1B:
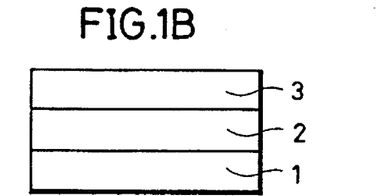

An X-ray sensitive resist 3 is formed on the surface of the wafer 1, as shown in FIG. 1B. The X-ray sensitive resist 3 is, for example, a PMMA (polymethyl methacrylate) positive resist, the material which absorbs an ion beam and whose absorbency depends on its thickness. This resist 3 is formed to a thickness of about 1 μm such that the implanted ion beam is not transmitted into the wafer 1.

Figure 1C:
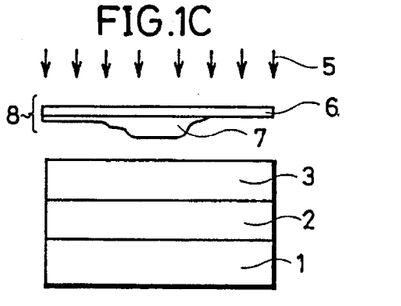

Next as shown in FIG. 1C, an X-ray mask 8 is first provided. X-ray exposure is carried out for an appropriate time by employing the X-ray mask 8. That is, an X-ray 5 is directed uniformly onto the X-ray sensitive resist 3 while scanning. The X-ray 5 has a wavelength of approximately 8.3 Å and is directed at an energy of approximately 30 J/cm². The X-ray mask 8 includes an X-ray transmission substrate 6 with low absorbency of the X-ray 5, and an X-ray absorber pattern 7 with high absorbency of the X-ray 5, formed on the transmission substrate 6. The X-ray absorber pattern 7 is formed to have locally different thicknesses corresponding to desired impurity profiles formed in the wafer 1 by ion implantation (which will be described later). The X-ray absorber pattern 7 is, for example, formed by employing a lithography by an FIB (Focused Ion Beam) or a selective milling process.

Detailed description will be given later of a method of manufacturing the X-ray mask 8.

Figure 1D:
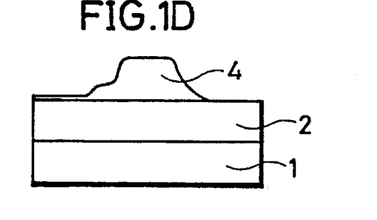

Next, referring to FIG. 1D, a latent image produced in the X-ray sensitive resist 3 due to the X-ray exposure is developed. This development causes formation of a desired X-ray sensitive resist pattern 4 with locally different film thicknesses in shape. It is noted that a thickness pattern of the X-ray sensitive resist pattern 4 and that of the X-ray absorber pattern 7 are counter-related to each other. That is, the X-ray sensitive resist pattern 4 is formed with a thickness pattern in accordance with a degree of shielding the irradiated X-ray.

Figure 1E:
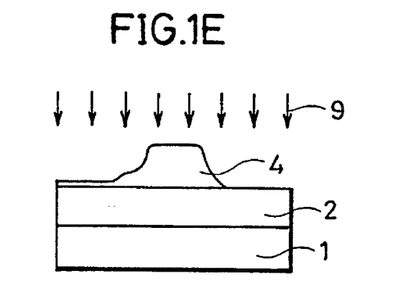
Figure 1F:
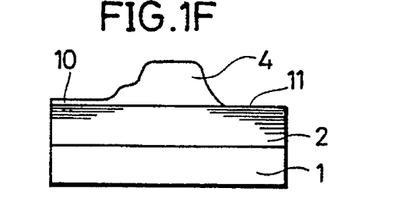

Referring to FIG. 1E, it is possible to distribute impurities in the wafer 1 by ion-implanting an ion beam 9 onto the whole surface of the wafer 1 onto which the ion beam is scanned to be directed uniformly. At this time, the ion beam 9 is implanted in the wafer 1 through the X-ray sensitive resist pattern 4. The ion beam 9 comprises, for example, $As^+$ ions with acceleration voltage of approximately 200 KeV, which are to be implanted in the amount of approximately $1.0 \times 10^{16}$ ions/cm$^2$. Thus there are formed in the wafer 1, an ion layer 10 of the source side with a smaller amount of the ions implanted and with a small depth of implantation, and an ion layer 11 of the drain side with a larger amount of the ions implanted and with a greater depth of implantation, as shown in FIG. 1F.

Figure 1G:
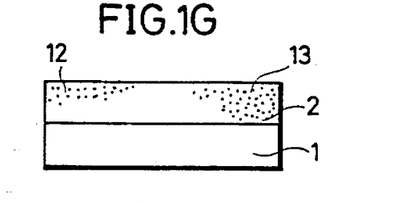

The X-ray sensitive resist pattern 4 is then removed from the upper surface of the wafer 1 by etching or the like, as shown in FIG. 1G. Thereafter, a thermal diffusion and then activation of the impurities in the wafer 1 allows formation of desired impurity profiles with locally different impurity profiles. The thermal diffusion is, for example, continuous irradiation at 950° C. for one minute by lamp anneal. This thermal diffusion makes it possible to form an n$^+$source 12 and an n$^+$drain 13 in the wafer 1 in a maximum depth of approximately 0.1 μm.

Figure 1H:
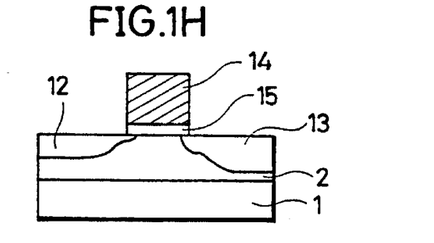

A gate electrode 14 is then formed between the source 12 and the drain 13, as shown in FIG. 1H. The gate electrode 14 is formed on a gate oxide film 15 to a thickness of about 0.1 μm and a width of about 0.3 μm. The gate electrode 14 and the gate oxide film 15 are formed by employing a film formation technology and the lithography and processing technologies. The gate oxide film 15 has a thickness of about 70 Å, and the gate electrode 14 is formed such as of polysilicon ion-implanted.

A method of forming the X-ray mask 8 shown in FIG. 1C will now be described with reference to FIGS. 2A–2E.

The X-ray mask 8 includes an X-ray transmitting substrate 6 and an X-ray absorber pattern 7. As a material of the X-ray transmitting substrate 6, a $Si_3N_4$ film is employed, for example, which is relatively highly transmissive to an X-ray of PdLa ($\lambda=8.3$ Å) and also highly transmissive to visible light required for optical alignment. As a material of the X-ray absorber pattern 7, a Au film with a relatively large X-ray absorption coefficient is employed, for example.

Figure 2A:
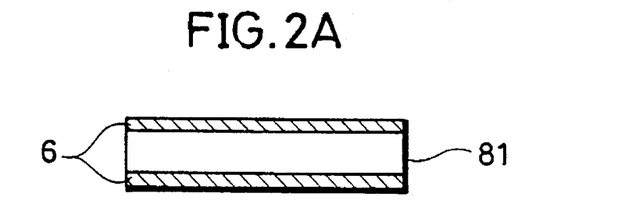
FIGS. 2A–2E are schematic sectional views showing the steps of manufacturing an X-ray mask of the first embodiment of the present invention.

First, the $Si^3N_4$ film is, for example, formed by the CVD method to a thickness of only approximately 2 μm uniformly on both the top surface and the reverse surface of a Si substrate 81 provided, thereby forming the X-ray transmitting substrate 6, as shown in FIG. 2A.

Figure 2B:
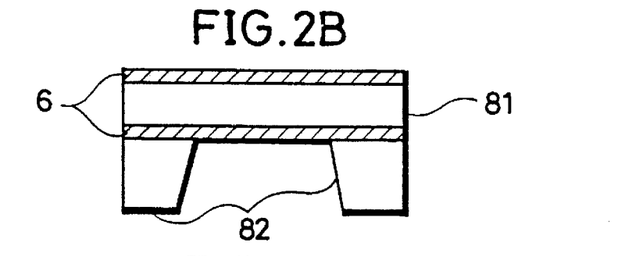

Next, as shown in FIG. 2B, the Si substrate 81 on which the X-ray transmitting substrate 6 is formed is reinforced by Pyrex ring 82 from the direction of its reverse surface.

Figure 2C:
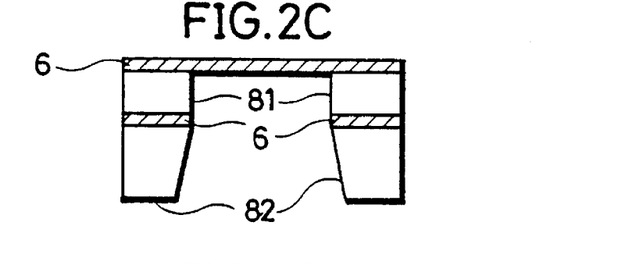

Then, portions of the X-ray transmitting substrate 6 on the reverse surface and portions of the Si substrate 81, which are not reinforced by the Pyrex ring 82, are etched away leaving the X-ray transmitting substrate 6 on the top surface, as shown in FIG. 2C.

Figure 2D:
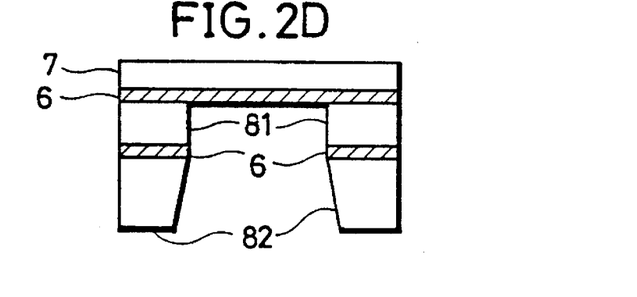

Referring to FIG. 2D, the Au film is uniformly formed to a thickness of about 0.05 to 1 μm on the X-ray transmitting substrate 6 on the top surface left after etching away, and thus the X-ray absorber pattern 7 is formed. The Au film is formed under a film formation condition that applies less stress to the $Si^3N_4$ film left after etching away.

Figure 2E:
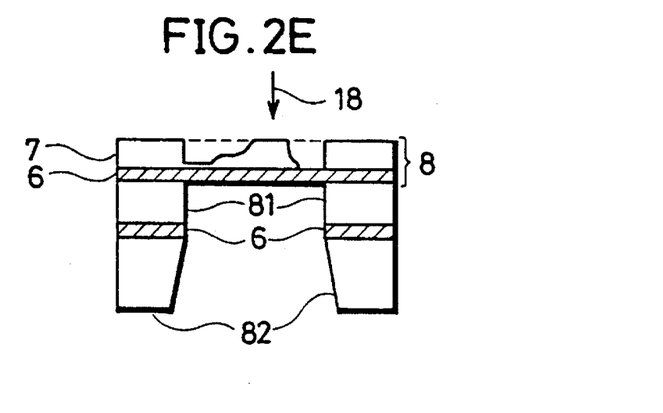

Finally, as shown in FIG. 2E, the X-ray absorber pattern 7 is formed employing, for example, the lithography by FIB 18 using Ga$^+$ions or the selective milling process so that the pattern 7 has locally different thicknesses, and thus the X-ray mask 8 is formed.

When the FIB process of the X-ray absorber pattern 7 is carried out under the condition of Ga$^+$ions at 30 KeV and 2 nA, for example, the X-ray absorber pattern 7 can be processed at an etching rate of approximately 1600 Å/sec for an irradiation area of 1 μm$^2$. The thickness of the film to be processed is adjusted depending on ion irradiation time.

FIGS. 3A–3H are schematic sectional views showing the steps of manufacturing an n channel field effect semiconductor device of the second embodiment of the present invention.

In the second embodiment, since the formation of a mask for ion implantation is carried out by FIB (Focused Ion Beam) exposure, the following method of mask formation is called FIB type.

Figure 3A:
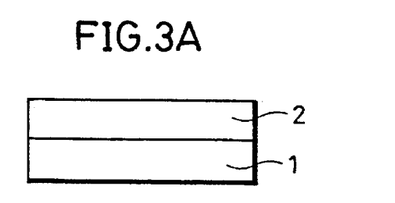
FIGS. 3A–3H are schematic sectional views showing the steps of manufacturing an n channel field effect semiconductor device of a second embodiment of the present invention.

An n type wafer 1 with a thickness of about 600 μm is provided including a p type well 2 formed to a thickness of about 5 μm therein, as shown in FIG. 3A.

Figure 3B:
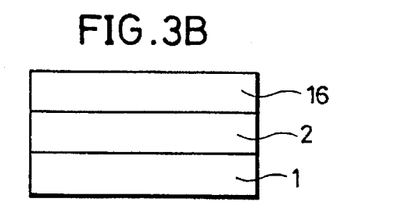

An FIB sensitive resist 16 is then formed on the surface of the wafer 1, in FIG. 3B. The FIB sensitive resist 16 is, for example, a PMMA positive resist, the material which absorbs the ion beam and absorbency thereof depends on its thickness. The FIB sensitive resist 16 is formed to such thickness that the implanted ion beam is not transmitted into the wafer 1.

Figure 3C:
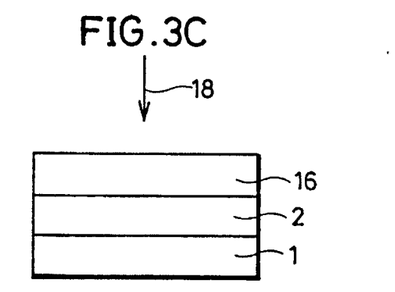

As shown in FIG. 3C, the FIB sensitive resist 16 is then subject to the FIB exposure required times by employing an FIB 18. The FIB 18 to be employed has a variation in ion species, implantation accelerating voltage, current density, diameter of an ion beam, scanning speed and the like. The FIB 18 is, for example, a Be$^{++}$ion beam with a variable acceleration voltage from 10 KeV to 100 KeV, the amount of which to be implanted is approximately 10$^3$ ions/cm$^2$.

Figure 3D:
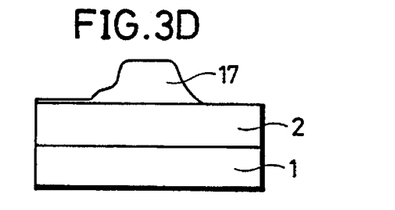
Figure 3E:
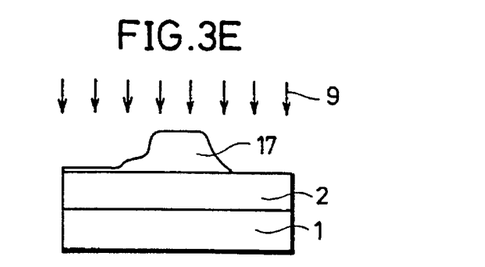

Next, as shown in FIG. 3D, a latent image produced in the FIB sensitive resist 16 by the FIB exposure is developed. This development of the latent image allows formation of a desired FIB sensitive resist pattern 17 with locally different thicknesses. That is, the FIB sensitive resist pattern 17 is formed to have locally different thicknesses corresponding to desired impurity profiles formed in the wafer 1 by ion implantation (which will be described later).

A source 12, a drain 13 and a gate electrode 14 are formed through the steps shown in FIGS. 3E–3H in the same manner as in the X-ray type method.

Thus, the X-ray sensitive resist pattern 4 and the FIB sensitive resist pattern 17 are formed as shielding films in ion implantation.

According to the FIB type method, the FIB sensitive resist pattern 17 is formed by several times of the FIB exposure; however, it may be formed by one-time FIB exposure employing the FIB, with successively or intermittently varied ion species, acceleration voltage, current density, ion beam diameter, scanning speed and the like in accordance with the thickness of a desired resist pattern.

The desired resist pattern with locally different thicknesses may be formed by repetitively twice or more times carrying out the steps of forming a material to be the resist pattern on the major surface of the wafer 1 and of patterning it by lithography employing light, an X-ray, an electron beam, an ion beam and the like.

As described above, according to the method of ion implantation employing the mask formed by the X-ray type or FIB type method, the ion layer 10 of the source side and the ion layer 11 of the drain side are formed asymmetrically.

For the miniaturized MOSFET, the following requirements are provided: (1) lowering the resistances of the source side and the drain side, (2) lowering an electric field in the vicinity of the drain side near the side surface of the gate in operation of the transistor, and (3) lowering the impurity concentration in the substrate in the vicinity of each pn junction region.

For satisfaction of the above requirement (1), the following solutions are proposed: (1-1) increasing the amount of impurities in the source and drain sides, (1-2) increasing (optimizing) the depth of impurity diffusion at the source and drain sides, or (1-3) decreasing as little as possible the amount of impurities in a region of the source and drain sides in the vicinity of the gate side. In order to satisfy the requirement (2), the following solutions are provided: (2-1) decreasing the larger amount of impurities at the drain side being closer to the gate side, (2-2) producing no impurities of the drain side beneath the gate, and (2-3) increasing a radius of curvature of an impurity profile so that a high electric field or concentration of the electric fields is not caused in a region of the drain side near the side surface of the gate. Finally, for satisfying the requirement (3), the following solutions are proposed: (3-1) distributing impurities so as to decrease the impurity concentration at the boundary of a well of the source side and that of the drain side, (3-2) distributing the impurities so as to decrease the impurity concentration at the boundary of a channel stopper of the source side and that of the drain side, and (3-3) distributing the impurities to decrease the concentration at the boundary of the well and the channel stopper.

As mentioned above, satisfying the requirements (1) through (3) results in the following effects. First of all, satisfying the requirement (1) allows the properties of the transistor to be improved. Further, satisfying the requirement (2) allows an increased breakdown voltage (BVds) for the ON state, an inhibited punch through, and a reduced hot carrier effect. Finally, satisfying the requirement (3) enables an increased breakdown voltage of each pn junction.

Figure 3F:
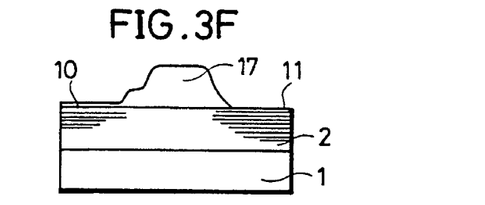
Figure 3G:
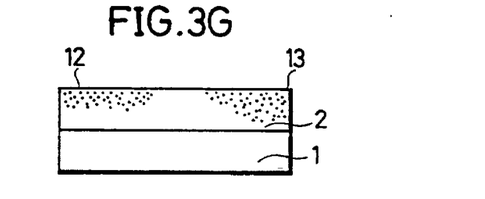
Figure 3H:
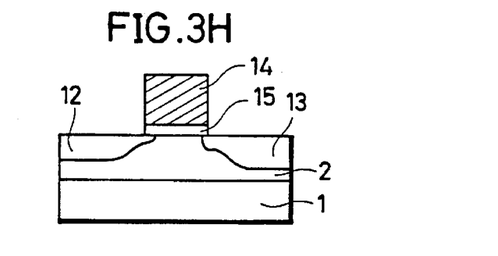

Assuming that the ion layer of the source side and that of the drain side are formed symmetrically in the wafer, it is difficult to fulfill the requirements (2) and (3) in consideration for the requirement (1), and thus there is a limitation in fulfilling both requirements at the same time. Such difficulty and limitation in the achievement of these requirements are the case with a single drain transistor and an LDD transistor. However, in this embodiment, as illustrated in FIGS. 1F and 3F, asymmetrical formation of the ion layers 10 and 11 facilitates simultaneous achievements of the above requirements (1) through (3).

Further, in this embodiment, since the impurity profiles at the source and drain sides have the configurations as illustrated, it is possible to realize the solutions (1-1) and (1-2) with respect to the requirement (1) and (2-1) and (2-3) with respect to the requirement (2) at the same time. As for the LDD transistor, the impurity profiles are of a dual-level structure; however, as this structure is formed of multi-levels, the requirements are improved more.

A description will be given on a difference between the above described conventional LDD structure (hereinafter referred to as normal LDD) where the source-side ion layer and the drain-side ion layer are formed symmetrically each other and an LDD structure (hereinafter referred to as modified LDD) where a source-side ion layer and a drain-side ion layer, formed in accordance with the present invention, are asymmetrically formed each other, with reference to the figures.

Figure 4A:
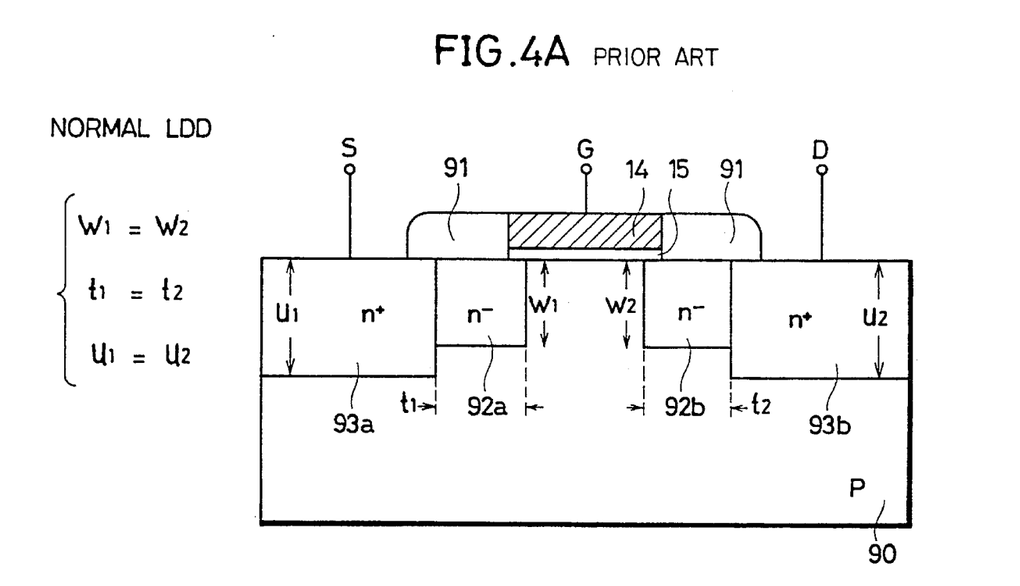
FIG. 4A is a schematic sectional view of an n channel type MOS transistor with a conventional symmetrical LDD structure.
Figure 4B:
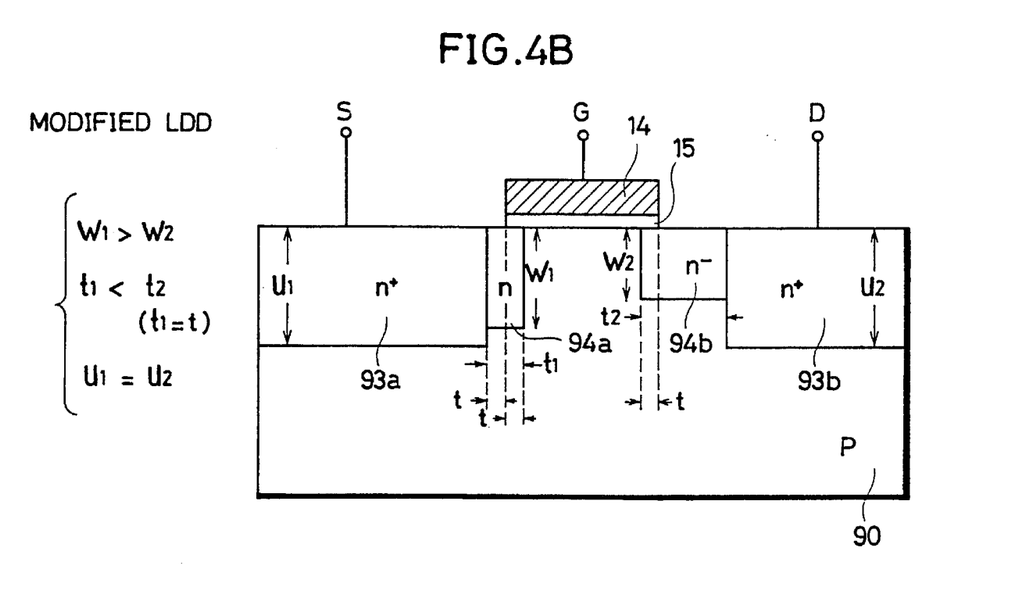
FIG. 4B is a schematic sectional view of an n channel type MOS transistor with asymmetrical LDD structure where formation of a mask for ion implantation described in the first and second embodiment.

FIG. 4A is a schematic sectional view of the normal LDD structure, and FIG. 4B is a schematic sectional view of the modified LDD structure. The LDD structure shown in FIG. 4A and 4B are, as examples, cross sectional views of an n channel MOS transistor.

Referring to FIG. 4A, the normal LDD structure comprises a p type semiconductor substrate 90, a gate electrode 14 formed on one major surface of the p type semiconductor substrate 90 with a gate oxide film 15 sandwiched therebetween, a sidewall insulator film (side-walls) 91 formed contacting sidewalls of the gate electrode 14, first diffusion layers 92a and 92b on a pair of source/drain regions of n⁻type, formed in one major surface of the p type semiconductor substrate 90 at opposite sides of the gate electrode 14, with one end of each first diffusion layer overlapping side portions of the gate electrode 14, and second diffusion layers 93a and 3b on a pair of source/drain regions of n⁺type, formed in one major surface of the p type semiconductor substrate 90 at the opposite sides of the gate electrode 14, with one end of each second diffusion layer overlapping side portions of the sidewalls 91 without overlapping the gate electrode 14. The second diffusion layers 93a and 93b are impurity diffusion layers with a concentration higher than that of the first diffusion layers 92a and 92b.

Referring to FIG. 4B, similarly to the normal LDD structure shown in FIG. 4A, the modified LDD structure comprises the p type semiconductor substrate 90, the gate oxide film 15, the gate electrode 14, the second diffusion layers 93a and 93b, and newly, first diffusion layers 94a and 94b on a pair of source/drain regions of n type, formed in one major surface of the p type semiconductor substrate 90 at the opposite sides of the gate electrode 14, with one end of each diffusion layer overlapping the side portions of the gate electrode 14 by a width t. The second diffusion layers 93a and 93b are impurity diffusion layers with a concentration higher than that of the first diffusion layers 94a and 94b. The first diffusion layer 94a has a higher concentration than that of the first diffusion layer 94b.

As shown in FIG. 4A, in the normal LDD, the first diffusion layer 92a has a depth $w_1$ equal to a depth $w_2$ of the first diffusion layer 92b and has a width $t_1$ equal to a width $t_2$ of the first diffusion layer 92b. Further, the second diffusion layer 93a has a depth $u_1$ equal to a depth $u_2$ of the second diffusion layer 93b.

As shown in FIG. 4B, in the modified LDD, the first diffusion layer 94a has a depth $w_1$ larger than that $w_2$ of the first diffusion layer 94b ($w_1 > w_2$) and has its width $t_1$ smaller than a width $t_2$ of the first diffusion layer 94b ($t_1 < t_2$ where $t_1 = 2t$). Further, a depth $u_1$ of the second diffusion layer 93a is equal to that $u_2$ of the second diffusion layer 93b.

In the normal LDD configured as shown in FIG. 4A, when the width $t_1$ becomes smaller, resistance at the source side becomes decreased; however, an electric field at the drain side becomes higher in the first diffusion layer 92b, so that hot carriers and thus punch through are liable to occur. This causes a problem that a reduction in the resistance at the source side is not compatible with an alleviation in the concentration of the electric field at the drain side; however, this problem can be eliminated in the modified LDD. As shown in FIG. 4B, in the modified LDD, the width $t_1$ is made equal to an overlapping margin (the width t) between the gate electrode 14 and the first diffusion layers 94a and 94b. Therefore, the modified LDD has a characteristic that since the first diffusion layer 93a or 93b inevitably exists beneath the ends of the gate electrode 14 even if there occurs a deviation in overlapping, no offset transistor is formed.

According to the method of ion implantation in accordance with the present invention, since different transistors with the different widths $t_1$ and $t_2$ can be formed on the same substrate as required by freely altering the widths $t_1$ and $t_2$, it is possible to achieve faster operation and further miniaturization of a semiconductor device compared to the conventional. In addition, when the impurity profiles in the first diffusion layers 94a and 94b (source/drain) are made in dual level or multi-level, it is possible to make more reduction in the resistances at the source and drain sides compatible with the alleviation in the concentration of the electric field at the drain side.

A description will now be given of a method of manufacturing the modified LDD shown in FIG. 4B by employing the above described X-ray type and FIB type methods.

First, the method of manufacturing the modified LDD by employing the X-ray type method will be described.

FIGS. 5A–5F are schematic sectional views showing the steps of manufacturing an n Channel type MOS transistor with the modified LDD by forming a mask for ion implantation by the X-ray exposure of one embodiment of the present invention.

The n channel type MOS transistor to be formed according to this embodiment is formed with the depths and widths in FIG. 4B set as follows: $u_1=u_2=0.15$ μm, $w_1=0.13$ μm, $w_2=0.1$ μm, $t_1=0.05$ μm, $t_2=0.1$ μm; and the width of the gate electrode 14 is set at 0.3 μm.

Figure 5A:
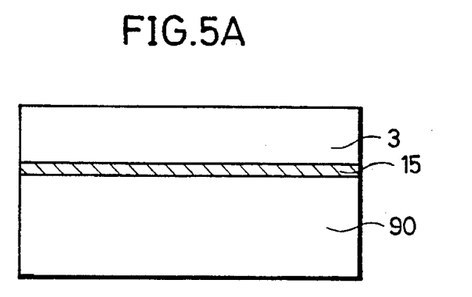
FIGS. 5A–5F are schematic sectional views showing the steps of manufacturing the n channel type MOS transistor with asymmetrical LDD structure by forming a mask for ion implantation by X-ray exposure according to the first embodiment of the present invention.

Referring to FIG. 5A, a gate oxide film 15 with a thickness of about 70 Å is formed on one major surface of a p type semiconductor substrate 90 in an approximately 600 μm thickness, and an X-ray sensitive resist (e.g., PMMA (polymethyl methacrylate) positive resist) 3 with a thickness of about 1 μm is formed on the gate oxide film 15.

Figure 5B:
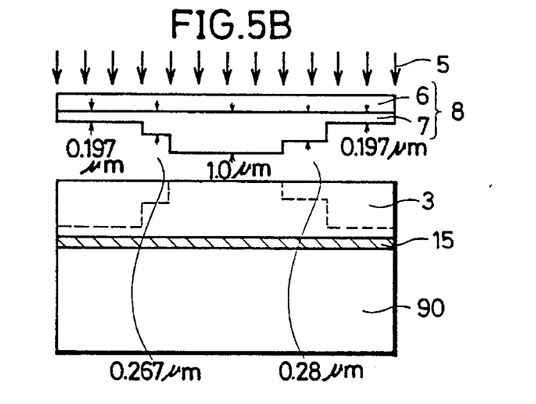

Next, referring to FIG. 5B, an X-ray 5 is directed as being scanned uniformly onto the X-ray sensitive resist 3, through the X-ray mask 8 manufactured through the steps described in the FIGS. 2A–2E.

The X-ray mask 8 comprises an X-ray transmitting substrate 6 (e.g., a $Si^3N_4$ film in an approximately 2 μm thickness) and an X-ray absorber pattern 7 (e.g., a Au film), and has different thicknesses at different portions as shown in FIG. 5B, through the manufacturing steps described in FIGS. 2A–2E.

The X-ray 5 to be directed has a wavelength λ=approximately 8.3 Å, an energy density approximately 30J/cm². Approximately 40% of the X-ray 5 is absorbed by the X-ray transmitting substrate 6, and the X-ray absorber pattern 7 absorbs the X-ray 5 depending on its thickness. In this case, absorbency of the X-ray 5 is evaluated by the following expression:

$$\text{absorbency} = 100 \times (1 - e^{-\mu l})(\%)$$

(where μ: a linear absorption coefficient of a given material with respect to an X-ray having a given wavelength λ, l: a thickness of the material).

In this example, with the X-ray 5 of λ=approximately 8.3 Å, the linear absorption coefficient of $Si^3N_4$ is μ=0.2 [μm⁻], while that of Au is μ=4.8 [μm−1].

An exposed film thickness of the PMMA positive resist employed as the X-ray sensitive resist 3 depends on the energy density of the directed X-ray 5. For example, when the energy density is 10.0J/cm² or more, the exposed film thickness is 1 μm or more. When the energy density is 0.0 to 3.0j/cm², the exposed film thickness is 0 μm. Therefore, as the energy density becomes 3.0J/cm² or more, the exposed film thickness becomes increased.

In this example, as shown in FIG. 5B, the X-ray 5 with a wavelength λ=approximately 8.3 Å is directed onto the PMMA positive resist employed as the x-ray sensitive resist 3, with its energy densities 7.0J/cm² for an about 0.197 μm-thick portion of the X-ray absorber pattern 7, 5.0J/cm² for an about 0.267 μm-thick portion, 0.0J/cm² for an about 1.0 μm-thick portion, and 4.7J/cm² for an about 0.28 μm-thick portion.

Figure 5C:
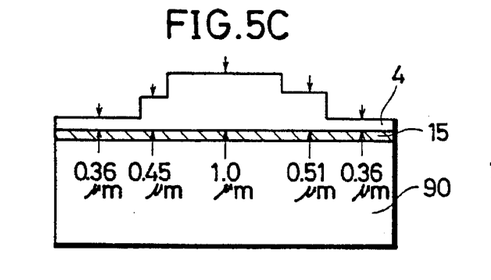

Referring to FIG. 5C, a latent image of the X-ray sensitive resist 3 formed by directing the X-ray 5 of FIG. 5B is developed. At this time, a thickness of an X-ray sensitive resist pattern 4 obtained by the development is relative to the thickness of the X-ray mask 8, and thus the thicknesses of the respective regions are shown in the figure.

Figure 5D:
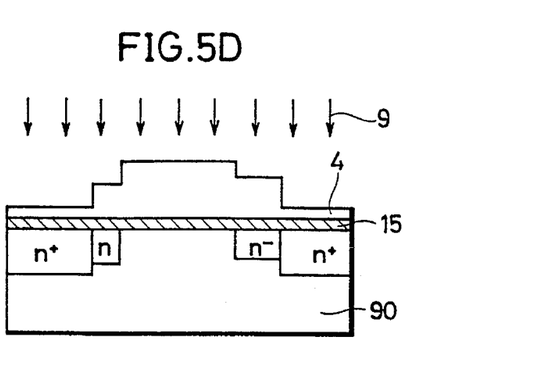

Referring to FIG. 5D, an ion beam 9 is ion-implanted uniformly on the major surface of the p type semiconductor substrate 90 as being scanned. The ion beam 9 includes, for example, $As^+$ions with an acceleration voltage of approximately 200.0 KeV, the amount of which to be implanted is $1.0 \times 10^{16}$ ions/cm² Consequently, an $n^+$ impurity layer and n type impurity layer and $n^-$impurity layer are formed in the p type semiconductor substrate 90, as shown in FIG. 5D.

Figure 5E:
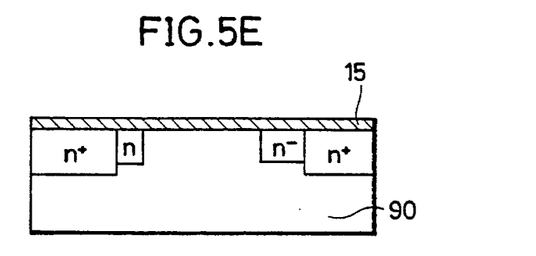
Figure 5F:
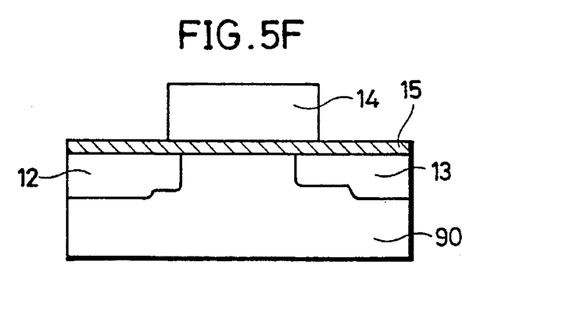

Referring to FIG. 5E, the X-ray sensitive resist pattern 4 is etched away from the p type semiconductor substrate 90, thereafter a gate electrode 14 of approximately 1000 Å in thickness, approximately 0.3 μm in width is formed in positional relation shown in FIG. 5F. After the formation of the gate electrode 14, impurity ions implanted into the p type semiconductor substrate 90 are activated by a heat treatment (annealing), so that a source 12 and a drain 13 are formed respectively at the opposite sides of the gate electrode 14 to form an n channel type MOS transistor with the characteristic of the modified LDD.

Next, a method of forming a mask for ion implantation by the FIB type method will be described. This method substitutes the step of directing the X-ray 5 through the X-ray mask 8 shown in FIG. 5B in the method of manufacturing the modified LDD by the X-ray type method for the step of directing an FIB 18.

Therefore, a description will be given here of only condition under which the FIB 18 is directed to the respective regions shown in FIG. 5B. The condition for directing the FIB 18 will be described in correspondence with the thickness of the X-ray absorber pattern 7 shown in FIG. 5B.

As shown in FIG. 5B, the FIB 18 is, for example, a $Be^{++}$ion beam, the amount of which to be implanted is approximately $10^3$ ions/cm². A variable acceleration voltage of the FIB 18 makes a film thickness of the PMMA positive resist variable. In this case, the FIB 18 is directed to the respective regions of the X-ray absorber pattern 7, with its acceleration voltage adjusted variable depending on the thickness of the X-ray absorber pattern 7 as follows: about 64.0 KeV for an about 0.197 μm-thick region, about 55.0

KeV for an about 0.267 μm-thick region, and about 49.0 KeV for an about 0.28 μm-thick region. An about 1.0 μm-thick region of the X-ray absorber pattern 7 is not irradiated with the FIB 18.

As described above, after directing the FIB 18, it is possible to obtain the PMMA positive resist pattern serving as a mask for ion implantation, desired regions of which are controlled to desired thicknesses, shown in FIG. 5C, through a developing process.

Next, a description will now be given of a method of forming a mask for ion implantation by etching away employing the FIB.

FIGS. 6A–6E are schematic sectional views showing the steps of manufacturing an n channel type MOS transistor with the modified LDD by forming a mask for ion implantation by the FIB process according to one embodiment of the present invention. The n channel type MOS transistor with the modified LDD formed in this embodiment has the same structure as that of the transistor shown in FIG. 5F.

Figure 6A:
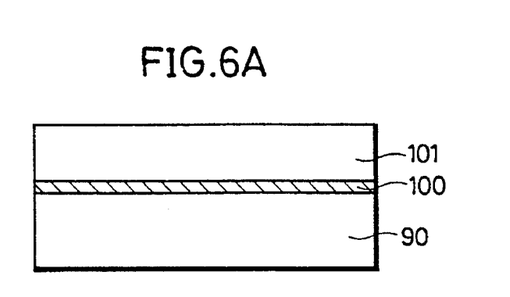
FIGS. 6A–6E are schematic sectional view showing the steps of manufacturing the n-channel type MOS transistor with asymmetrical LDD structure by forming a mask for ion implantation by an FIB (Focused Ion Beam) process according to the second embodiment of the present invention.

First, referring to FIG. 6A, a pad oxide film 100 with a thickness of about 100 Å is formed on the major surface of a p type semiconductor substrate 90 with a thickness of about 600 μm, and a $SiO_2$ ion-beam absorber 101 is deposited to a thickness of about 0.3 μm on the pad oxide film 100.

Figure 6B:
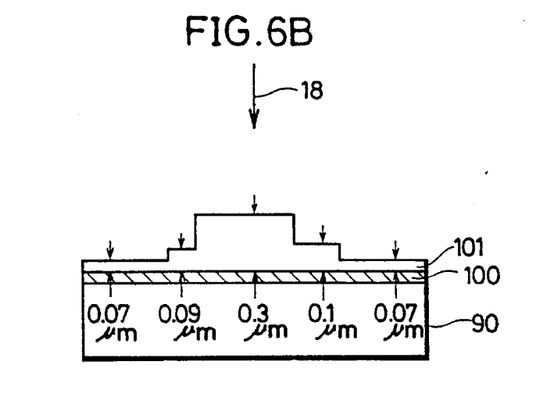

As shown in FIG. 6B, a mask for ion implantation is formed by etching away employing the FIB 18. In detail, the major surface of the p type semiconductor substrate 90 is irradiated with, for example, an ion beam FIB 18 comprising $Ga^+$ions with its acceleration voltage about 20.0 KeV, its acceleration current about 2.0 mA, and its etching rate about 5000.0 Å/sec for an area 1 μm². Then, the ion beam absorber 101 is processed by etching to form a desired mask for ion implantation. Therefore, an irradiation time is set variable for each region to be irradiated as follows. For example, related to a thickness of the ion beam absorber 101 shown in FIG. 6B, the irradiation time of the FIB 18 is set to about 2.17 sec for an about 0.07 μm-thick region, about 2.38 sec for an about 0.09 μm-thick region, and about 2.5 sec for an about 0.1 μm-thick region. A region with a thickness of about 0.3 μm is not irradiated with the FIB 18.

As described above, the FIB 18 etching process with its irradiation time set variable makes it possible to obtain the ion beam absorber 101 as the mask for ion implantation, formed to have locally desired thicknesses shown in FIG. 6B.

According to the FIB-etching process, the ion beam absorber 101 may be formed by several times of FIB etching employing the FIB 18, with at least one parameter varied such as ion species, acceleration voltage, current density, ion beam diameter, scanning speed and the like in accordance with the thickness of a desired absorber pattern; or it may be formed by one-time FIB etching employing the FIB 18, with successively or intermittently varied ion species, acceleration voltage, current density, ion beam diameter, scanning speed and the like in accordance with the thickness of a desired absorber pattern.

Figure 6C:
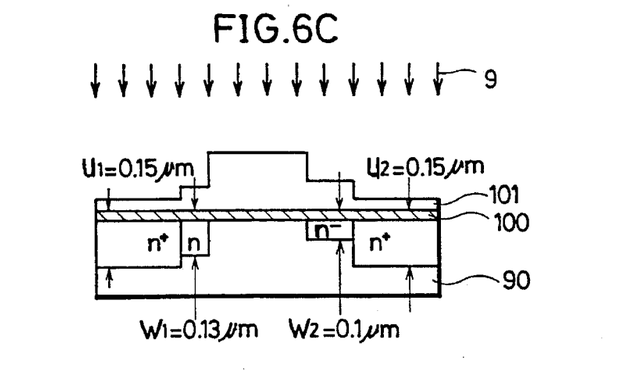

Next, referring to FIG. 6C, when a $As^+$ion beam 9 with its acceleration voltage about 250.0 KeV, the amount of which to be implanted is about $1.0 \times 10^{16}$ ions/cm² is ion-implanted into the p type semiconductor substrate 90, impurity profiles with desired thicknesses can be obtained in desired regions in the substrate 90.

Figure 6D:
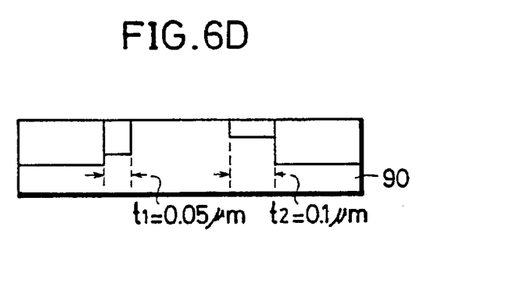

Referring to FIG. 6D, the ion beam absorber 101 and the pad oxide film 100 are etched away from the p type semiconductor substrate 90.

Figure 6E:
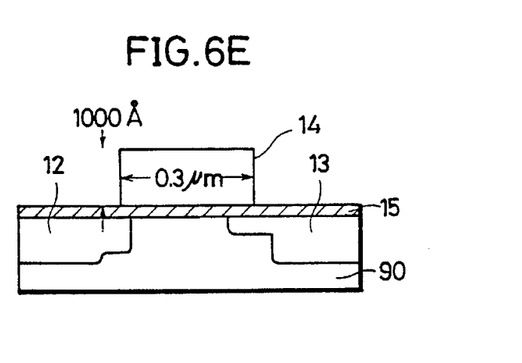

Thereafter, as shown in FIG. 6E, a gate oxide film 15 of about 70.0 Å in thickness is formed on the major surface of the p type semiconductor substrate 90, and then polysilicon is deposited on the gate oxide film 15 to form a gate electrode 14. An impurity layer is then activated by a heat treatment. Thus, it makes it possible to obtain the n channel type MOS transistor with the same structure as the one in FIG. 5F.

Figure 7:
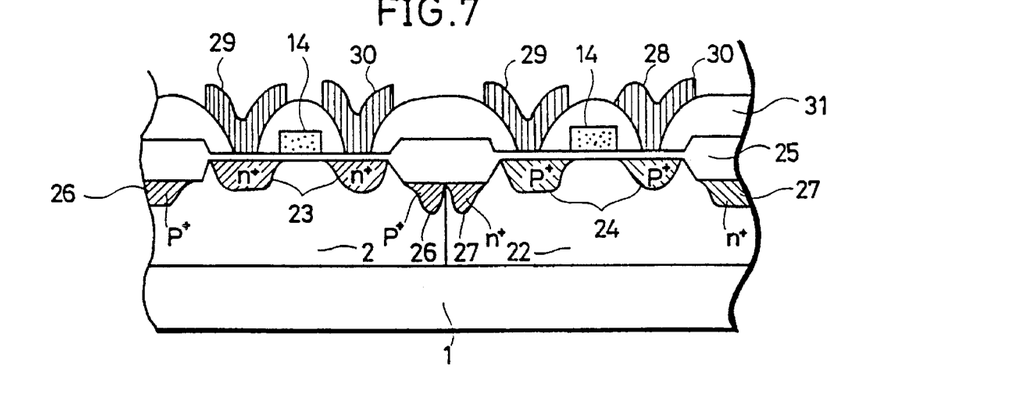
FIG. 7 is a schematic sectional view of an integrated circuit where a formation of a mask for ion implantation described in the first and second embodiments is adapted for the manufacture of the integrated circuit.

FIG. 7 is a schematic sectional view of an integrated circuit when the X-ray type or FIB type formation of the mask for ion implantation is applied to the manufacture of the integrated circuit. As shown in FIG. 7, an n channel MOSFET 20 and a p channel MOSFET 21 are formed on a common n type wafer 1.

First, the n channel MOSFET 20 and p channel MOSFET 21 have an n⁺source/drain and a p⁺source/drain, respectively, formed by the X-ray type or FIB type formation of the mask. The respective channel stopper portions of the n channel MOSFET 20 and the p channel MOSFET 21 are also formed by the X-ray type or FIB type formation of the mask. Although the other elements of these MOSFETs 20 and 21 are formed in the manufacturing method known to those skilled in the art, the steps of manufacturing these elements will be described with reference to FIG. 7.

First of all, the structure of the integrated circuit shown in FIG. 7 will be described. This integrated circuit comprises an n channel MOSFET 20 and a p channel MOSFET 21. This integrated circuit further comprises an n type wafer 1 shared by both MOSFETs, a p type well 2 and a n type well 22, formed on the wafer 1, an impurity profile (an n⁺source/drain) 23 formed in the n channel MOSFET 20 by the method of ion implantation according to the present invention, another impurity profile (a p⁺source/drain) 24 formed in the MOSFET 21 by the same method of ion implantation, a field insulator film 25 for insulating the impurity profiles 23 and 24, channel stoppers 26 and 27 for isolating the adjacent MOSFETs, a gate electrode 14, an Al film 28, a source electrode 29 and a drain electrode 30 formed of the Al film 28, and an interlayer film 31 for insulating the respective electrodes.

A method of manufacturing the integrated circuit of FIG. 7 will now be described.

The n type wafer 1 is first provided. A resist pattern for forming the n type well 22 is formed in the n type wafer 1. Thereafter, impurities to be the n type well 22 are ion-implanted in the wafer 1. The resist pattern for forming the n type well 22 is then removed, and a resist pattern for forming the p type well 2 is formed. After that, impurities to be the p type well 2 are ion-implanted, and the resist pattern for forming the p type well 2 is then removed. After the removal, a heat treatment causes diffusion and activation of the ion-implanted impurities so as to form the p type well 2 and the n type well 22 in the n type wafer 1. A nitride film is then formed on the n type wafer 1 by the CVD to form a resist pattern for forming a field insulator film 25 thereon and to etch the nitride film. Thereafter, the resist pattern for forming the field insulator film 25 is removed, and the field insulator film 25 is then formed by thermal oxidation. After this formation, the nitride film is removed. Next, after forming a gate oxide film by thermal oxidation, a layer such as of polysilicon for the gate electrode 14 is formed. Then, impurities for forming the gate electrode 14 are doped in the polysilicon layer, and thereafter forming a resist pattern for forming the gate electrode 14. Etching is then carried out for forming the gate electrode 14 to remove the resist pattern.

Now, by the method of ion implantation according to the present invention, a mask alignment is carried out for the gate electrode 14 to form a resist pattern to be a mask for forming the impurity profile (the n⁺source/drain) 23. Ions are then implanted therein to remove the resist pattern. Next, the same process as above is carried out for the impurity profile (the p⁺source/drain) 24. Thereafter, the impurity profiles (the n⁺source/drain) 23 and (the p⁺source/drain) 24 are formed by activation through a heat treatment.

The interlayer film 31 is then formed on the n type wafer 1 by the CVD method. After this formation, a resist pattern for forming the source electrode 29 and the drain electrode 30 is formed thereon for a contact formation. After the formation of the resist pattern, the interlayer film 31 is etched and then the resist pattern is removed. Thereafter, Al is sputtered to form the Al film 28. After forming the resist pattern for forming the source electrode 29 and the drain electrode 30 on the Al film 28, the Al film 28 is etched and then the resist pattern is removed.

The integrated circuit shown in FIG. 7 is manufactured through the above described procedure.

It is possible to form the channel stoppers 26 and 27 by the method of ion implantation according to the present invention, and the steps of this formation are to be carried out after the removal of the resist pattern for forming the field insulation film 25.

Figure 8A:
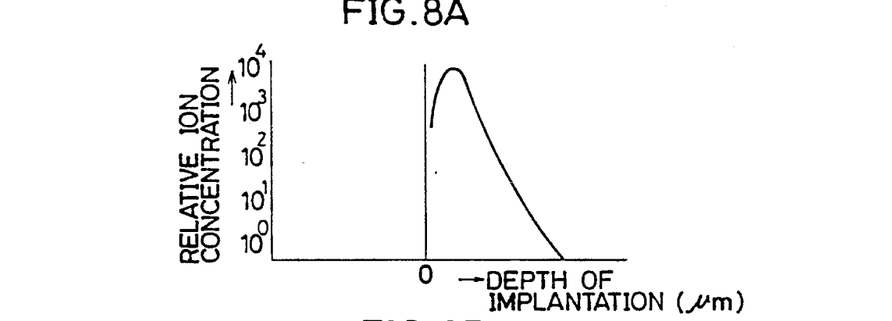
FIGS. 8A–8C are graphs showing dependency of ion beam absorption of an ion beam absorber material on its thickness in a method of ion implantation according to the present invention.
Figure 8B:
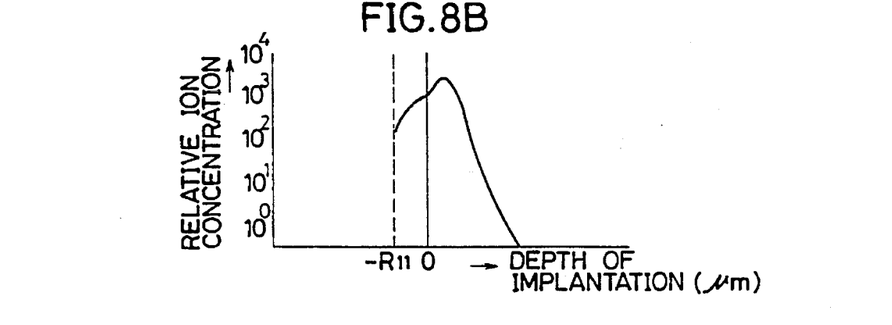
Figure 8C:
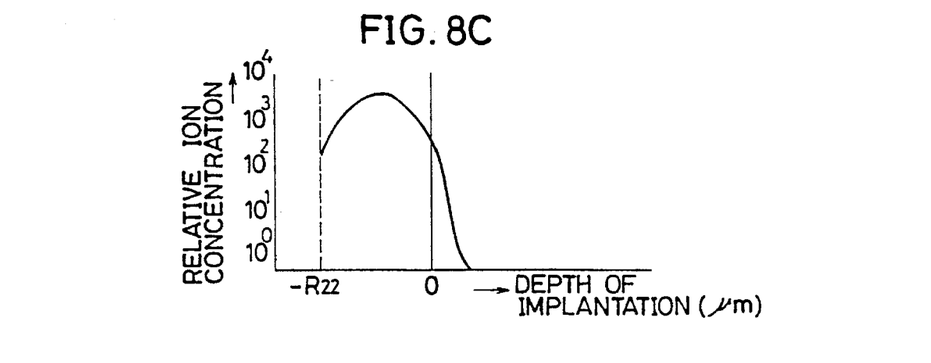

FIGS. 8A–8C are graphs showing dependency of ion beam absorption of the ion beam absorber material in its thickness by the method of ion implantation of the present invention.

The thickness of the mask formed by the X-ray type or FIB type method of this invention depends on the properties shown in FIGS. 8A–8C.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:

a semiconductor substrate of a first conductivity type having a major surface;

a first source/drain region comprising:
  a first diffusion layer of a second conductivity type having a first depth and a first impurity concentration formed in the major surface of said semiconductor substrate;
  a second diffusion layer of said second conductivity type having a second depth and a second impurity concentration formed in the major surface of said semiconductor substrate in direct contact with said first diffusion layer, and extending from said first diffusion layer a first distance parallel to said semiconductor substrate; and a second source/drain region spaced apart from said first source/drain region with a channel region therebetween, said second source/drain region comprising:
  a third diffusion layer of said second conductivity type having a third depth and a third impurity concentration spaced apart from said second diffusion layer in the major surface of said semiconductor substrate by said channel region;
  a fourth diffusion layer of said second conductivity type having said first depth and said first impurity concentration formed in the major surface of said semiconductor substrate in direct contact with said third diffusion layer, said third diffusion layer extending from said fourth diffusion layer a second distance, greater than the first distance, parallel to said semiconductor substrate; and a gate electrode formed on the major surface of said semiconductor substrate over said channel region between said second and third diffusion layers and extending over portions of said second and third diffusion layers;

said first depth being larger than said second depth, said second depth being larger than said third depth, said first impurity concentration being higher than said second impurity concentration, and said second impurity concentration being higher than said third impurity concentration.

2. A semiconductor device comprising:

a semiconductor substrate of a first conductivity type having a major surface;

a first source/drain region comprising:
  a first diffusion layer of a second conductivity type having a first depth and a first impurity concentration formed in the major surface of said semiconductor substrate;
  a second diffusion layer of said second conductivity type having a second depth and a second impurity concentration formed in the major surface of said semiconductor substrate and contacting said first diffusion layer through a first interface region, and extending from said first interface region a first distance parallel to said semiconductor substrate; and a second source/drain region spaced apart from said first source/drain region with a channel region therebetween, said second source/drain region comprising:
  a third diffusion layer of said second conductivity type having a third depth and a third impurity concentration spaced apart from said second diffusion layer in the major surface of said semiconductor substrate by said channel region;
  a fourth diffusion layer of said second conductivity type having said first depth and said first impurity concentration formed in the major surface of said semiconductor substrate and contacting said third diffusion layer through a second interface region, said third diffusion layer extending from said second interface region a second distance, greater than the first distance, parallel to said semiconductor substrate; and a gate electrode formed on the major surface of said semiconductor substrate over said channel region between said second and third diffusion layers and extending over portions of said second and third diffusion layers;

said first depth being larger than said second depth, said second depth being larger than said third depth, said first impurity concentration being higher than said second impurity concentration, and said second impurity concentration being higher than said third impurity concentration, wherein the impurity profile of the first source/drain region increases in concentration and depth in a stepwise or gradual manner extending away from said gate electrode.

3. A semiconductor device comprising:

a semiconductor substrate of a first conductivity type having a major surface;

a first source/drain region comprising:
  a first diffusion layer of a second conductivity type having a first depth and a first impurity concentration formed in the major surface of said semiconductor substrate;

a second diffusion layer of said second conductivity type having a second depth and a second impurity concentration formed in the major surface of said semiconductor substrate and contacting said first diffusion layer through a first interface region, and extending from said first interface region a first distance parallel to said semiconductor substrate; and a second source/drain region spaced apart from said first source/drain region with a channel region therebetween, said second source/drain region comprising:

a third diffusion layer of said second conductivity type having a third depth and a third impurity concentration spaced apart from said second diffusion layer in the major surface of said semiconductor substrate by said channel region;

a fourth diffusion layer of said second conductivity type having said first depth and said first impurity concentration formed in the major surface of said semiconductor and contacting said third diffusion layer substrate through a second interface region, said third diffusion layer extending from said second interface region a second distance, greater than the first distance, parallel to said semiconductor substrate; and a gate electrode formed on the major surface of said semiconductor substrate over said channel region between said second and third diffusion layers and extending over portions of said second and third diffusion layers;

said first depth being larger than said second depth, said second depth being larger than said third depth, said first impurity concentration being higher than said second impurity concentration, and said second impurity concentration being higher than said third impurity concentration, wherein the impurity profile of the second source/drain region increases in concentration and depth in a stepwise or gradual manner extending away from said gate electrode.

4. A semiconductor device according to claim 2, wherein the impurity profile of the second source/drain region increases in concentration and depth in a stepwise or gradual manner extending away from said gate electrode.

* * * * *